(12) United States Patent
Watanabe

(10) Patent No.: US 7,795,879 B2
(45) Date of Patent: Sep. 14, 2010

(54) TESTING APPARATUS

(75) Inventor: Daisuke Watanabe, Tokyo (JP)

(73) Assignee: Advantest Corporation, Tokyo (JP)

( * ) Notice: Subject to any disclaimer, the term of this patent is extended or adjusted under 35 U.S.C. 154(b) by 165 days.

(21) Appl. No.: 12/107,086

(22) Filed: Apr. 22, 2008

(65) Prior Publication Data

US 2008/0218178 A1  Sep. 11, 2008

Related U.S. Application Data

(63) Continuation of application No. PCT/JP2006/320546, filed on Oct. 16, 2006.

(30) Foreign Application Priority Data

Oct. 28, 2005  (JP)  ............................. 2005-315294

(51) Int. Cl.
*G01R 31/02* (2006.01)
(52) U.S. Cl. ...................... 324/537; 324/555
(58) Field of Classification Search ................ 324/537, 324/765, 158.1, 555
See application file for complete search history.

(56) References Cited

U.S. PATENT DOCUMENTS 3,723,874 A * 3/1973 Hamon et al. ............... 324/765

FOREIGN PATENT DOCUMENTS

| DE | 1541837 | 7/1969 |
|----|---------|--------|
| DE | 10017622 | 11/2000 |
| JP | 09-312586 | 12/1997 |
| JP | 2000-171524 | 6/2000 |

OTHER PUBLICATIONS

"Office Action German counterpart application", issued on Aug. 7, 2009, p. 1-p. 14.

* cited by examiner

*Primary Examiner*—Vincent Q Nguyen
(74) *Attorney, Agent, or Firm*—Jianq Chyun IP Office

(57) ABSTRACT

There is provided a test apparatus for testing a device under test including a pre-emphasis circuit. The pre-emphasis circuit emphasizes a predetermined component of an output signal of the device under test and outputs the resulting output signal. Here, the test apparatus includes a filter that eliminates an emphasized component that is generated by the pre-emphasis circuit, from the output signal output from the device under test, and a testing section that measures the output signal output from the filter, and judges whether the device under test is acceptable based on a result of the measurement. The test apparatus can accurately test the pre-emphasis function of the device under test including the pre-emphasis circuit.

15 Claims, 10 Drawing Sheets

TESTING APPARATUS

CROSS REFERENCE TO RELATED APPLICATION

This is a continuation application of PCT/JP2006/320546 filed on Oct. 16, 2006 which claims priority from a Japanese Patent Application No. 2005-315294 filed on Oct. 28, 2005, the contents of which are incorporated herein by reference.

BACKGROUND

Technical Field

The present invention relates to a test apparatus for testing the pre-emphasis function of a device under test such as a semiconductor circuit, a fixture board used in the test apparatus, a pin electronics card and a test method.

A conventionally known electronic device such as a semiconductor circuit emphasizes a predetermined component of an output signal, and outputs the resulting signal. For example, such an electronic device is known to include a pre-emphasis circuit that emphasizes a predetermined component of an output signal in order that the output signal from the electronic device is corrected in advance for the attenuation to be generated by a transmission line used when the electronic device is implemented.

The pre-emphasis circuit outputs the output signal having a waveform with rising and falling edges being emphasized, for example. The output signal is transmitted through the transmission line used when the electronic device is implemented. In this manner, a receiver circuit can receive a signal which has been corrected in terms of the attenuation components. When the electronic device include such a pre-emphasis circuit, it is necessary to perform a test as to whether the pre-emphasis circuit correctly functions. No related reference materials including patent documents have been recognized, and such documents are therefore not mentioned here.

It is, however, difficult to test the functionality of the pre-emphasis circuit during the test of the electronic device including the pre-emphasis circuit. Generally speaking, the signal transmission distance between the device under test and the test apparatus is much shorter than the signal transmission distance that is defined when the electronic device is implemented. This means that the test apparatus measures the output signal whose predetermined component remains emphasized. Therefore, the test apparatus can not accurately test the functionality of the pre-emphasis circuit included in the device under test.

For example, the test apparatus may detect the logic values of the output signal at predetermined timings in order to check the set-up time and the hold time of the output signal from the device under test. In this case, the test apparatus may detect emphasized logic values of the output signal depending on the predetermined timings. Accordingly, the logic values detected by the test apparatus may be different from the logic values of the output signal which are received by the receiver circuit when the electronic device is implemented.

In place of the logic values of the output signal, the test apparatus may detect the waveform of the output signal and compare the detected waveform with a specified waveform. To detect the waveform of the output signal, the test apparatus uses known means such as a real-time oscilloscope, a sampling oscilloscope and a time interval analyzer. Use of such an apparatus, however, increases the testing time, which in turn lowers the throughput of the device fabrication.

One of the known apparatuses to detect the waveform of the output signal is a digitizer circuit. When the test apparatus tests the device under test by using a digitizer circuit, however, it is required to mount a digitizer circuit at each of a large number of input circuits of the test apparatus. This significantly increases the cost of the test apparatus.

Another possible method to detect the waveform of the output signal is to sequentially vary the strobe timing so as to plot the wave form of the output signal by using a conventional test apparatus. Here, the test apparatus varies the strobe timing at an interval equal to the test period. Therefore, it takes a very long time to measure a sufficiently large number of samples. As stated above, the conventional test apparatus can not accurately test the device including the pre-emphasis circuit, or requires a high cost to accurately test such a device.

SUMMARY

Therefore, it is an object of an aspect of the innovations herein to provide a test apparatus, a fixture board, a pin electronics card and a test method which are capable of overcoming the above drawbacks accompanying the related art. The above and other objects can be achieved by combinations described in the independent claims. The dependent claims define further advantageous and exemplary combinations of the innovations herein.

According to the first aspect related to the innovations herein, one exemplary test apparatus may include a test apparatus for testing a pre-emphasis function of a device under test including a pre-emphasis circuit. Here, the pre-emphasis circuit emphasizes a predetermined component of an output signal of the device under test and outputs the resulting output signal. The test apparatus includes a filter that attenuates the output signal output from the device under test in a substantially same manner as a transmission line used when the device under test is implemented attenuates the output signal output from the device under test, and a testing section that measures the output signal output from the filter, and tests the pre-emphasis function of the device under test based on a result of the measurement.

According to the second aspect related to the innovations herein, one exemplary fixture board may include a fixture board for use in a test apparatus for testing a pre-emphasis function of a device under test including a pre-emphasis circuit. The pre-emphasis circuit emphasizes a predetermined component of an output signal of the device under test and outputs the resulting output signal, and the fixture board connects a performance board on which the device under test is placed and a testing section that judges whether the device under test is acceptable to each other. Here, the fixture board includes a filter that attenuates the output signal output from the device under test in substantially a same manner as a transmission line used when the device under test is implemented attenuates the output signal.

According to the third aspect related to the innovations herein, one exemplary pin electronics card may include a pin electronics card for use in a test apparatus for testing a pre-emphasis function of a device under test including a pre-emphasis circuit. The pre-emphasis circuit emphasizes a predetermined component of an output signal of the device under test and outputs the resulting output signal, and the pin electronics card exchanges a signal with each pin of the device under test. Here, the pin electronics card includes a filter that attenuates the output signal output from the device under test in substantially a same manner as a transmission line used when the device under test is implemented attenuates the output signal.

According to the fourth aspect related to the innovations herein, one exemplary test method may include a test method for testing a pre-emphasis function of a device under test including a pre-emphasis circuit. Here, the pre-emphasis circuit emphasizes a predetermined component of an output signal of the device under test and outputs the resulting output signal. The test method includes attenuating the output signal output from the device under test, measuring the output signal output as a result of the attenuation, judging whether a result of the measurement indicates that the attenuation is substantially the same as attenuation to be caused in the output signal by a transmission line used when the device under test is implemented, and testing the pre-emphasis function of the device under test based on a result of the judgment.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

DESCRIPTION OF EXEMPLARY EMBODIMENTS

Hereinafter, an embodiment of the present invention will be described. The embodiment does not limit the invention according to the claims, and all the combinations of the features described in the embodiment are not necessarily essential to means provided by aspects of the invention.

Figure 1:
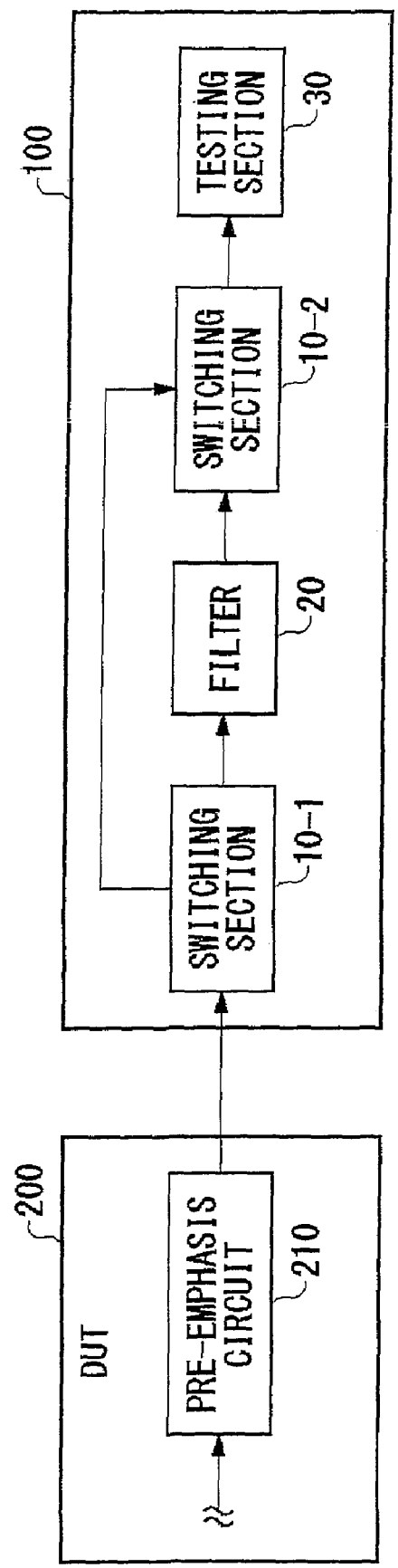
FIG. 1 illustrates an exemplary configuration of a test apparatus 100 for testing a device under test 200.

FIG. 1 illustrates an exemplary configuration of a test apparatus 100 for testing a device under test 200. The device under test 200 is an electronic device such as a semiconductor circuit. The device under test 200 has a pre-emphasis circuit 210 at its output end. The device under test 200 generates an output signal in compliance with a predetermined specification, and inputs the generated output signal into the pre-emphasis circuit 210. The pre-emphasis circuit 210 emphasizes a predetermined component of the output signal output from the device under test 200, and outputs the resulting signal. For example, the pre-emphasis circuit 210 outputs the output signal having a waveform with its rising and falling edges being emphasized in accordance with the attenuation to be caused by a transmission line through which the output signal is transmitted when the device under test 200 is implemented.

The pre-emphasis circuit 210 may be configured to emphasize the high-frequency components of the output signal. For example, the pre-emphasis circuit 210 may be configured to reduce the high-frequency impedance on the transmission line through which the output signal is transmitted, or to superimpose harmonic components onto the output signal. Configured in the above-described manner, the device under test 200 can output a signal which is corrected in advance for the loss to be caused by the transmission line through which the signal is transmitted to a receiver circuit when the device under test 200 is implemented. Which is to say, the device under test 200 can transmit the signal complying with the predetermined specification, to the receiver circuit.

The test apparatus 100 includes switching sections 10-1 and 10-2 (hereinafter collectively referred to as the switching sections 10), a filter 20, and a testing section 30. The filter 20 attenuates the output signal output from the device under test 200 in substantially the same manner as the transmission line used when the device under test 200 is implemented. For example, the filter 20 attenuates the output signal by eliminating the emphasized component that is expected to be generated by the pre-emphasis circuit 210, from the output signal output from the device under test 200. The emphasized component that is expected to be generated by the pre-emphasis circuit 210 is determined in advance by the amount of the signal attenuation which is generated by the transmission line used when the device under test 200 is implemented. For example, the pre-emphasis circuit 210 has design specifications, setting values and the like which are all determined by the amount of the signal attenuation. The filter 20 may be a low pass filter, for example. The signal pass characteristics of the filter 20 may be determined in advance by the characteristics of the pre-emphasis circuit 210. For example, the signal pass characteristics of the filter 20 may be set in advance according to the design specifications of the pre-emphasis circuit 210.

The characteristics of the pre-emphasis circuit 210 are set based on the loss caused by the transmission line of the output signal used when the device under test 200 is implemented. In other words, the pre-emphasis circuit 210 corrects the signal input thereto such that the signal received by the receiver circuit when the device under test 200 is implemented has substantially the same waveform as the signal input into the pre-emphasis circuit 210. The filter 20 eliminates the emphasized component that is expected to be generated by the pre-emphasis circuit 210. According to such configurations, when the pre-emphasis circuit 210 correctly operates in compliance with the design specifications, setting values and the like, the signal output from the filter 20 has substantially the same waveform as the signal received by the receiver circuit when the device under test 200 is implemented.

The testing section 30 measures the signal output from the filter 20, and tests the functionality of the pre-emphasis circuit 210 based on the result of the measurement. For example, the testing section 30 may judge whether the pre-emphasis circuit is acceptable, based on the judgment as to whether the signal output from the filter 20 satisfactorily has the set-up time and the hold time which are set in advance for the device under test 200. It should be noted that the signal output from the filter 20 is substantially the same as the signal received by the receiver circuit when the device under test 200 is implemented.

For this reason, the signal received by the testing section 30 is expected to comply with the specifications determined in advance for the device under test 200. As a result, the testing section 30 can judge whether the pre-emphasis circuit 210 correctly operates, by performing normal conventional tests such as the test of the set-up time and the hold time based on the received signal.

The switching sections 10 switch whether to input the output signal output from the device under test 200 into the filter 20 or the testing section 30. Specifically speaking, the switching sections 10 can switch between (i) inputting the output signal into the testing section 30 via the filter 20 so as to test the device under test 200 including the pre-emphasis circuit 210 and (ii) directly inputting the output signal into the testing section 30 without involving the filter 20 so as to test the device under test 200 excluding the pre-emphasis circuit 210.

The switching sections 10 preferably have excellent high-frequency characteristics. For example, the switching sections 10 may be configured by using a high-frequency relay or Micro Electro Mechanical System (MEMS) relay. The switching sections 10 are preferably formed by using passive elements, rather than active elements.

Figure 2:
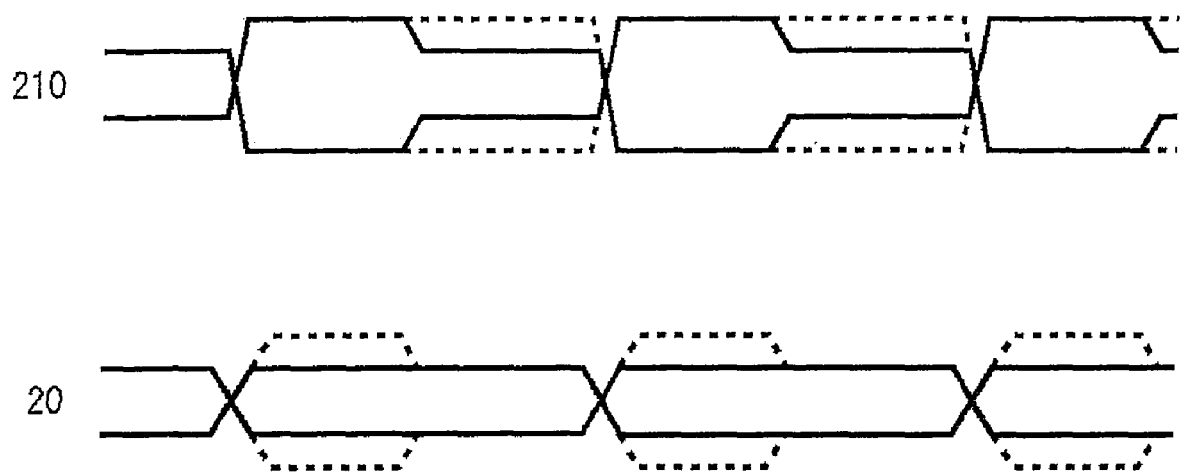
FIG. 2 illustrates exemplary waveforms of the signals output from a pre-emphasis circuit 210 and a filter 20.

FIG. 2 illustrates exemplary waveforms of the signals respectively output from the pre-emphasis circuit 210 and the filter 20. As illustrated in FIG. 2, the pre-emphasis circuit 210 emphasizes the rising and falling edges of the output signal, thereby outputting a waveform with steep edges.

The filter 20 eliminates, from the signal output from the pre-emphasis circuit 210, the emphasized component that is expected to be generated by the pre-emphasis circuit 210, and outputs the resulting signal. For this reason, the signal output from the filter 20 is substantially the same as the signal received by the receiver circuit when the device under test 200 is implemented.

Figure 3:
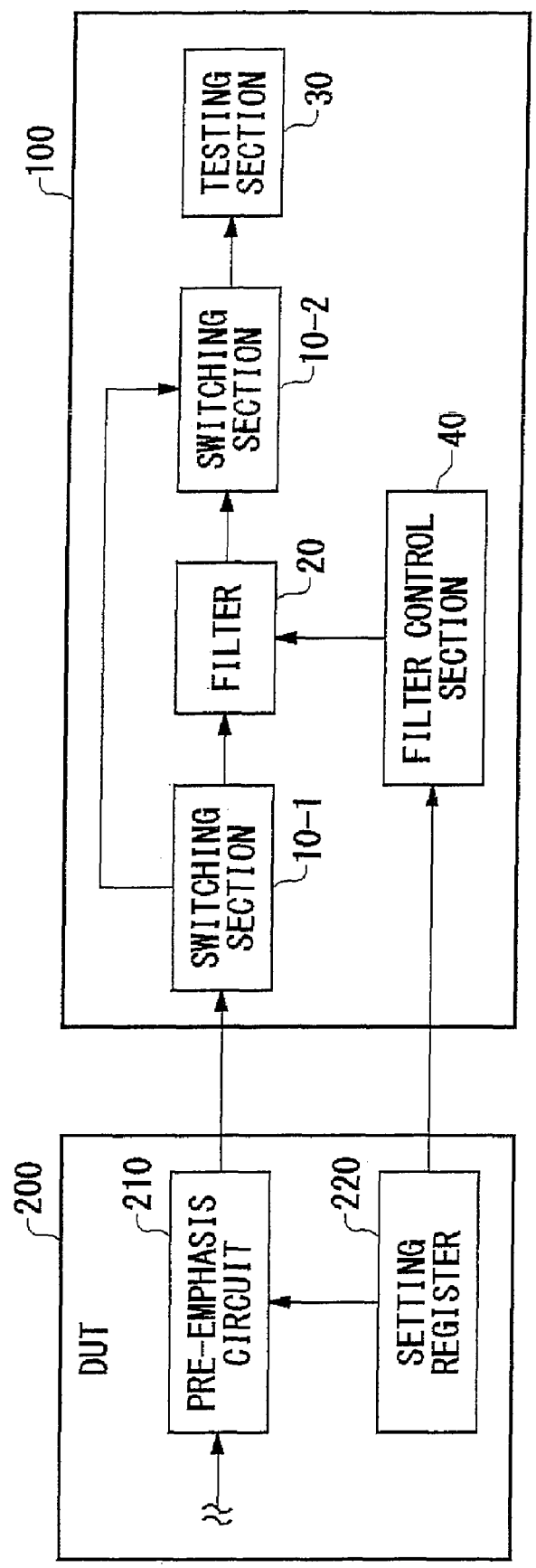
FIG. 3 illustrates another exemplary configuration of the test apparatus 100.

FIG. 3 illustrates another exemplary configuration of the test apparatus 100. According to the present example, the test apparatus 100 includes a filter control section 40 in addition to the constituents of the test apparatus 100 described with reference to FIG. 1. Here, the test apparatus 100 tests the device under test 200 which additionally include a setting register 220.

The filter control section 40 is supplied in advance with emphasized component information indicating the emphasized component which is expected to be generated by the pre-emphasis circuit 210, and controls the signal pass characteristics of the filter 20 in accordance with the emphasized component information. For example, the filter control section 40 may receive the emphasized component information from a user or the like. The emphasized component information may be related to the characteristics of the pre-emphasis circuit 210. The filter control section 40 controls the characteristics of the filter 20 such that the filter 20 can eliminate the emphasized component indicated by the emphasized component information.

The setting register 220 stores thereon a setting value indicating the emphasized component which is expected to be generated by the pre-emphasis circuit 210. The pre-emphasis circuit 210 generates the emphasized component in accordance with the setting value stored on the setting register 220. For example, the setting register 220 may store thereon the amount of the attenuation caused by the signal transmission line used when the device under test 200 is implemented, as the setting value. If such is the case, the setting register 220 may store thereon the amount of the attenuation in association with each different frequency band of the output signal. With reference to the setting value stored on the setting register 220, the pre-emphasis circuit 210 corrects in advance the output signal to compensate for the attenuation of the signal transmission line.

The filter control section 40 may obtain in advance the setting value stored on the setting register 220, and control the signal pass characteristics of the filter 20 in accordance with the obtained setting value. For example, when the setting value represents the attenuation amount, the filter control section 40 controls the characteristics of the filter 20 such that the amount of the signal attenuation provided by the filter 20 becomes substantially equal to the setting value. The above-described configurations enable the test apparatus 100 to appropriately perform the functionality test even when the pre-emphasis circuit 210 has variable settings. Additionally, the test apparatus 100 can test the pre-emphasis circuit 210 as to whether the pre-emphasis circuit 210 correctly operates in accordance with the emphasized component information or setting value.

Figure 4:
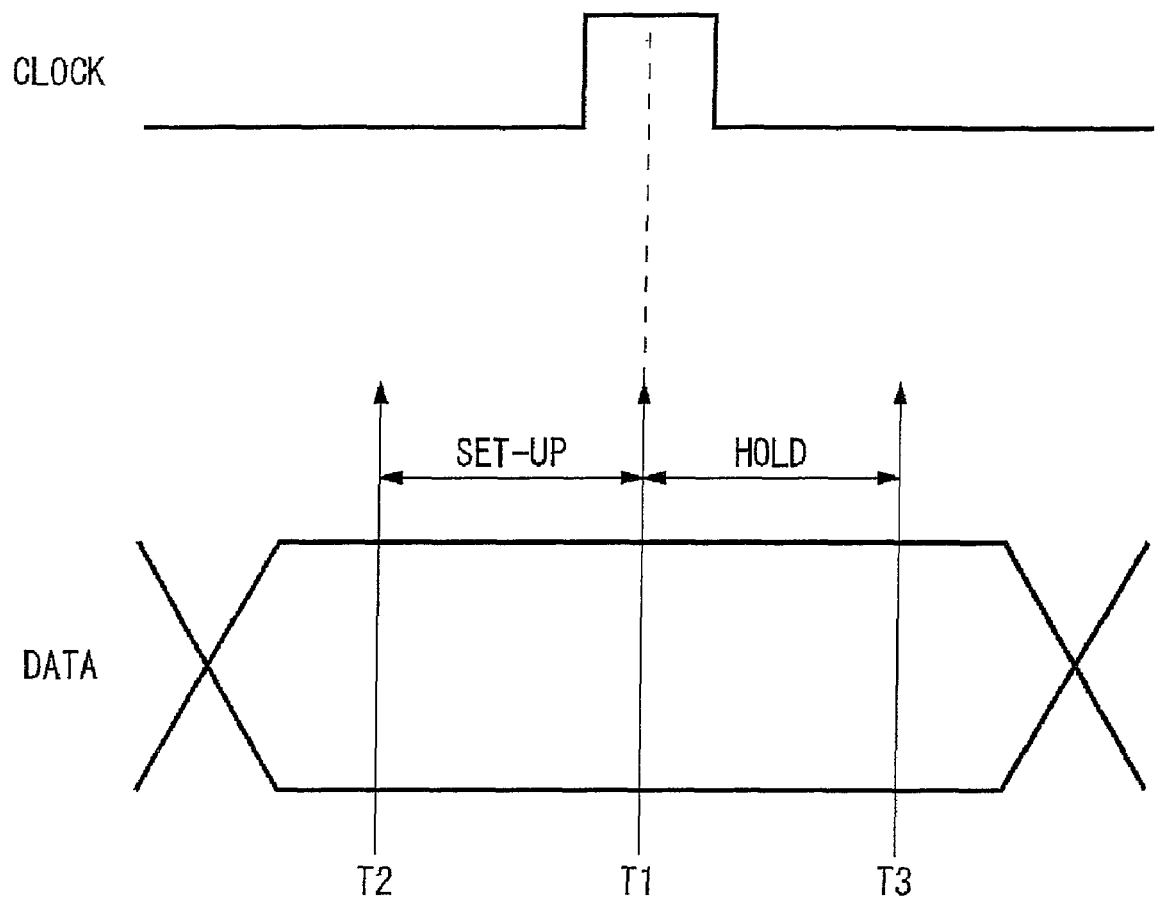
FIG. 4 illustrates an example of the test performed by a testing section 30.

FIG. 4 illustrates an example of the test performed by the testing section 30. According to the present example, the testing section 30 performs a test as to whether the set-up time and the hold time of the input signal satisfy predetermined specification values.

The set-up time indicates how long the timing at which the logic value of the data being transmitted is settled precedes the timing of the clock at which the logic value of the data is detected, and the hold time indicates how long the logic value of the data being transmitted is maintained from the timing of the clock at which the logic value of the data is detected.

As mentioned above, the pre-emphasis circuit 210 emphasizes the edges of the output signal. Therefore, the testing section 30 can judge whether the pre-emphasis circuit 210 correctly functions by detecting the logic value of the output signal at the timing determined by the specification values of the set-up time and the hold time which are expected to be satisfied by the output signal.

Figure 5:
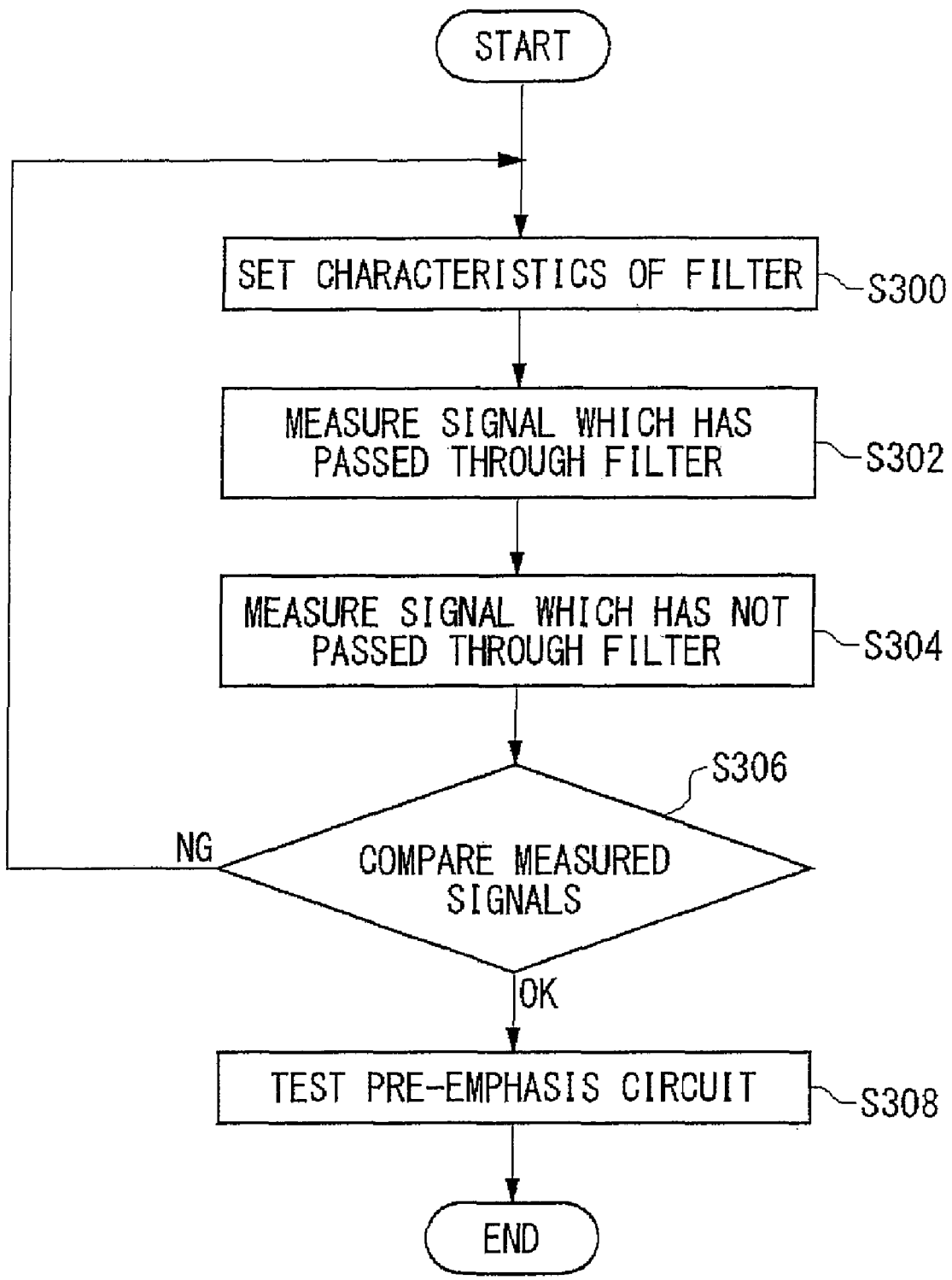
FIG. 5 is a flow chart illustrating an exemplary operation of the test apparatus 100.

FIG. 5 is a flow chart illustrating an exemplary operation of the test apparatus 100. To start with, the filter control section 40 sets the signal pass characteristics of the filter 20 based on the emphasized component information supplied in advance thereto, in the filter setting step S300. In the next first measuring step S302, the testing section 30 controls the switching sections 10 so as to measure the output signal which has passed through the filter 20. In the following second measuring step S304, the testing section 30 controls the switching sections 10 so as to measure the output signal which has not passed through the filter 20.

In the subsequent signal comparing step S306, the testing section 30 compares the output signal which has passed through the filter 20 and the output signal which has not passed through the filter 20 to each other, so as to evaluate whether the signal pass characteristics of the filter 20 are substantially the same as predetermined characteristics. For example, the testing section 30 evaluates whether the amount of the signal attenuation caused by the filter 20 is substantially the same as the amount of the signal attenuation caused by the transmission line used when the device under test 200 is implemented. Here, the amount of the signal attenuation caused by the transmission line used when the device under test 200 is implemented may be supplied to the test apparatus 100 in advance by the user, or calculated from the setting value stored on the setting register 220, as mentioned above. In the signal comparing step S306, the testing section 30 may function as a filter evaluating section performing the above evaluation.

When the signal pass characteristics of the filter 20 are judged different from the predetermined characteristics in the signal comparing step S306, the test apparatus 100 repeats the procedure from the step S300 to the step S306. In this case, the filter control section 40 may set the characteristics of the filter 20 in the filter setting step S300, with reference to the evaluation result obtained in the signal comparing step S306.

When the signal pass characteristics of the filter 20 are judged to be the same as the predetermined characteristics in the signal comparing step S306, the testing section 30 tests the device under test 200 including the pre-emphasis circuit 210 in the testing step S308. Here, the testing section 30 controls the switching sections 10, so as to test the device under test 200 based on the output signal which has passed through the filter 20. This test may examine the set-up time and the hold time as mentioned above.

The accuracy of the test is dependent on whether the characteristics of the filter 20 are the same as the characteristics of the transmission line used when the device under test 200 is implemented. The test relating to the present example makes it possible to adjust the characteristics of the filter 20 to be accurately the same as the characteristics of the transmission line used when the device under test 200 is implemented. Accordingly, the test relating to the present example can accurately test the pre-emphasizing function of the device under test 200.

Figure 6:
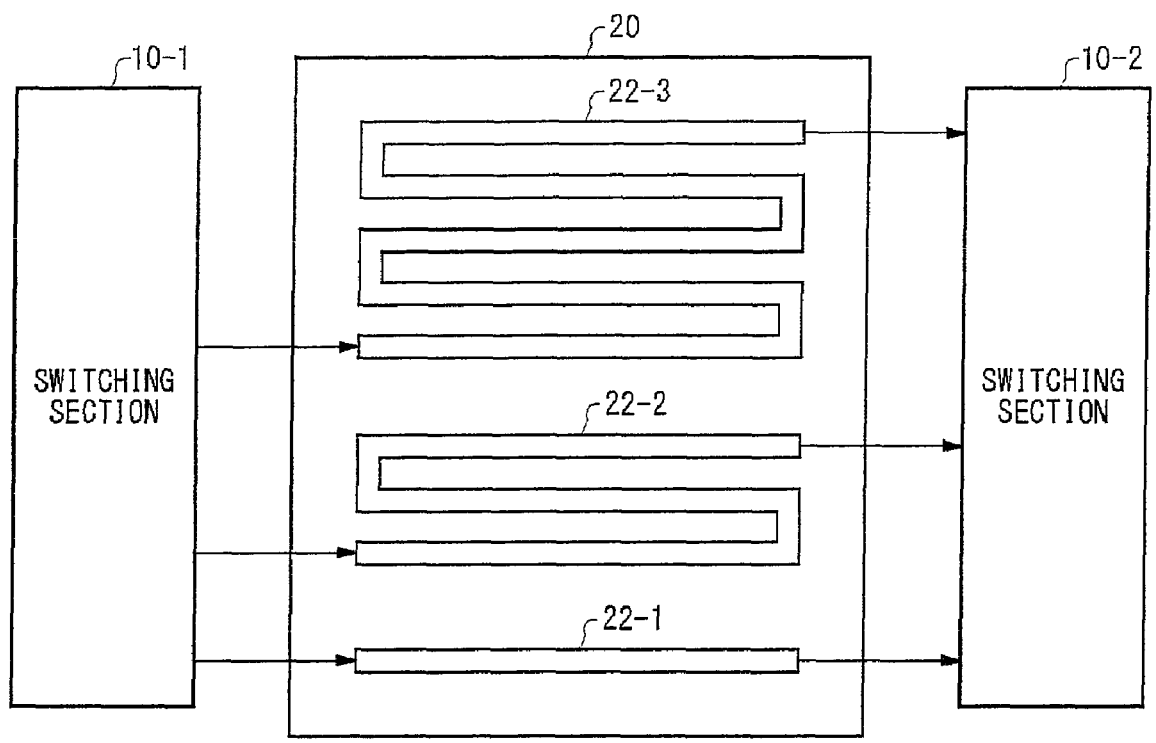
FIG. 6 illustrates an exemplary configuration of the filter 20.

FIG. 6 illustrates an exemplary configuration of the filter 20. According to the present example, the filter 20 includes a plurality of transmission lines 22-1 to 22-3 each of which has a different line length. The transmission lines 22-1 to 22-3 are hereinafter collectively referred to as transmission lines 22. The amount of the signal attenuation caused by the transmission lines 22, per unit length, may be substantially the same as the amount of the signal attenuation caused by the transmission line used when the device under test 200 is implemented, per unit length. For example, the transmission lines 22 may be formed by using substantially the same material as the transmission line used when the device under test 200 is implemented. The transmission lines 22 may be strip lines, micro strip lines, or coplanar strip lines which are formed on the substrate.

The filter control section 40 controls the signal pass characteristics of the filter 20 by selecting one of the transmission lines 22 through which the output signal is to be transmitted. For example, the filter control section 40 may receive the emphasized component information indicating the length of the transmission line used when the device under test 200 is implemented, and select one of the transmission lines 22 in accordance with the received length. Here, the selection among the transmission lines 22 may be made by the switching sections 10. Alternatively, the switching sections 10 may select two or more of the transmission lines 22, and cause the output signal to transmit through the selected transmission lines 22. By performing such a control, the switching sections 10 can set the total length of the transmission lines 22 through which the output signal is transmitted at a desired value corresponding to the expected characteristics of the filter 20.

Figure 7:
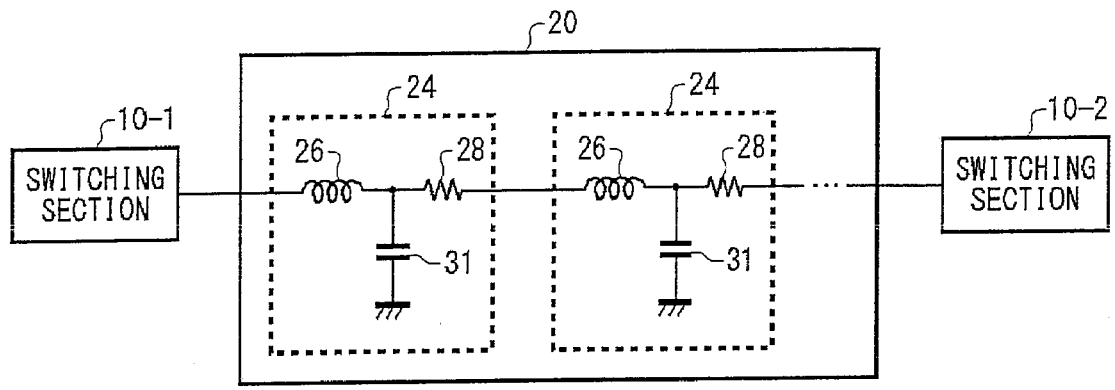
FIG. 7 illustrates another exemplary configuration of the filter 20.

FIG. 7 illustrates another exemplary configuration of the filter 20. According to the present example, the filter 20 has a plurality of circuit blocks 24 cascaded to each other. Each circuit block 24 is an LCR circuit including an inductance component 26, a capacitance component 31, and a resistance component 28. The resistance component 28 in each circuit block 24 is connected in series to the inductance component 26 in the following circuit block 24. The capacitance component 31 is provided between the ground potential and the connection point between the capacitance component 31 and the resistance component 28. The switching sections 10 are preferably designed to be capable of controlling the number of circuit blocks 24 which are connected to each other in series and through which the output signal is transmitted. By utilizing the above configurations, the filter control section 40 controls the signal pass characteristics of the filter 20.

Figure 8:
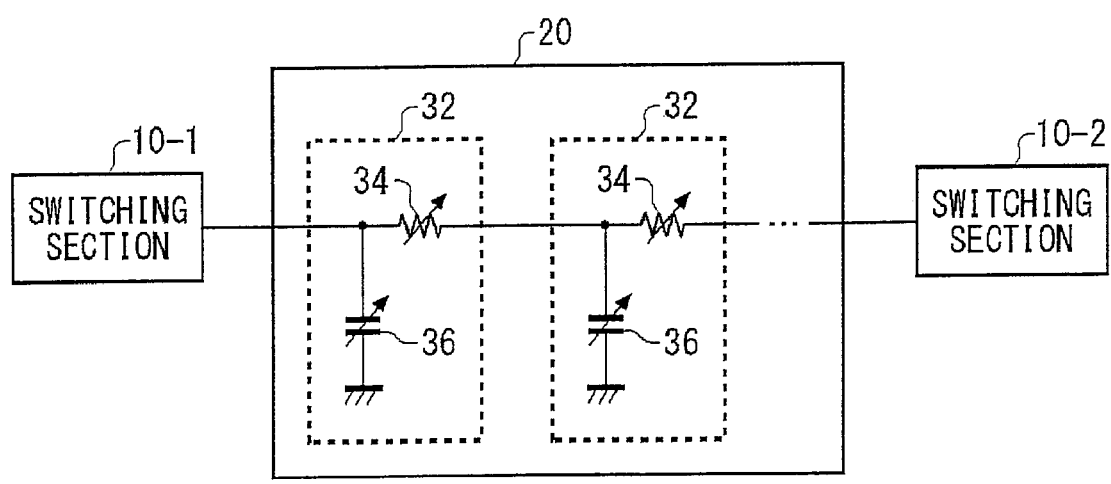
FIG. 8 illustrates another exemplary configuration of the filter 20.

FIG. 8 illustrates another exemplary configuration of the filter 20. According to the present example, the filter 20 has a plurality of circuit blocks 32 cascaded to each other. Each circuit block 32 is an RC circuit including a variable resistance component 34 and a variable capacitance component 36. The variable resistance component 34 in each circuit block 32 is connected to the variable resistance components 34 in adjacent circuit blocks 32. The variable capacitance component 36 is provided between one end of the variable resistance component 34 and the ground potential, in each circuit block 32.

The switching sections 10 are preferably designed to be capable of controlling the number of circuit blocks 32 which are connected to each other in series and through which the output signal is transmitted. By utilizing the above configurations, the filter control section 40 controls the signal pass characteristics of the filter 20. Alternatively, the filter control section 40 may control the signal pass characteristics of the filter 20 by controlling the impedance of the variable resistance component 34 and/or the capacitance value of the variable capacitance component 36 in each circuit block 32.

The constituents of the circuit blocks 24 or 32 described with reference to FIG. 7 or 8 may be discrete parts that are separately manufactured. The inductance components 26 in the circuit blocks 24 may be part of the patterns formed by using the wafer fabrication process. The respective constituents of the circuit blocks 24 may have variable characteristics, similarly to the constituents of the circuit blocks 32.

Figure 9:
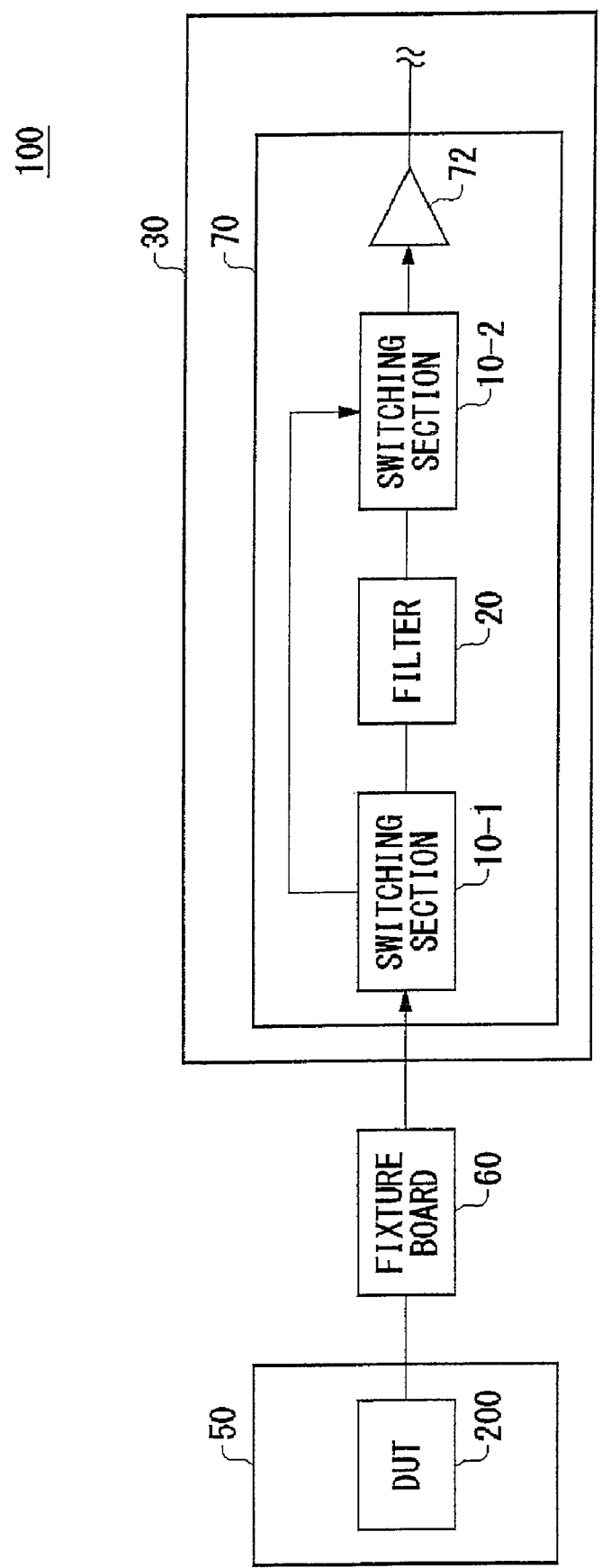
FIG. 9 illustrates another exemplary configuration of the test apparatus 100.

FIG. 9 illustrates another exemplary configuration of the test apparatus 100. According to the present example, the test apparatus 100 includes a performance board 50, a fixture board 60 and a pin electronics card 70, in addition to the constituents of the test apparatus 100 described with reference to FIG. 1 or 3.

The performance board 50 has the device under test 200 placed thereon. For example, the performance board 50 is provided in a test head. The testing section 30 is provided in a main body section separate from the test head.

The pin electronics card 70 is provided in the testing section 30. The pin electronics card 70 exchanges signals with the device under test 200. For example, the pin electronics card 70 includes a driver that outputs a signal to the device under test 200, and a comparator 72 that receives a signal from the device under test 200. The driver and the comparator 72 are provided in correspondence with each pin of the device under test 200. The pin electronics card 70 may be detachably disposed in the test apparatus 100.

The fixture board 60 electrically connects the testing section 30 and the performance board 50 to each other through the pin electronics card 70. For example, the fixture board 60 is provided between the test head and the main body section, and has a cable that provides electrical connection between the testing section 30 and the performance board 50.

According to the present example, the switching sections 10, the filter 20, and the filter control section 40 described with reference to FIG. 1 or 3 are provided in the pin electronics card 70. For example, the switching sections 10, the filter 20 and the filter control section 40 are provided in association with each comparator 72, between the comparator 72 and the fixture board 60.

Figure 10:
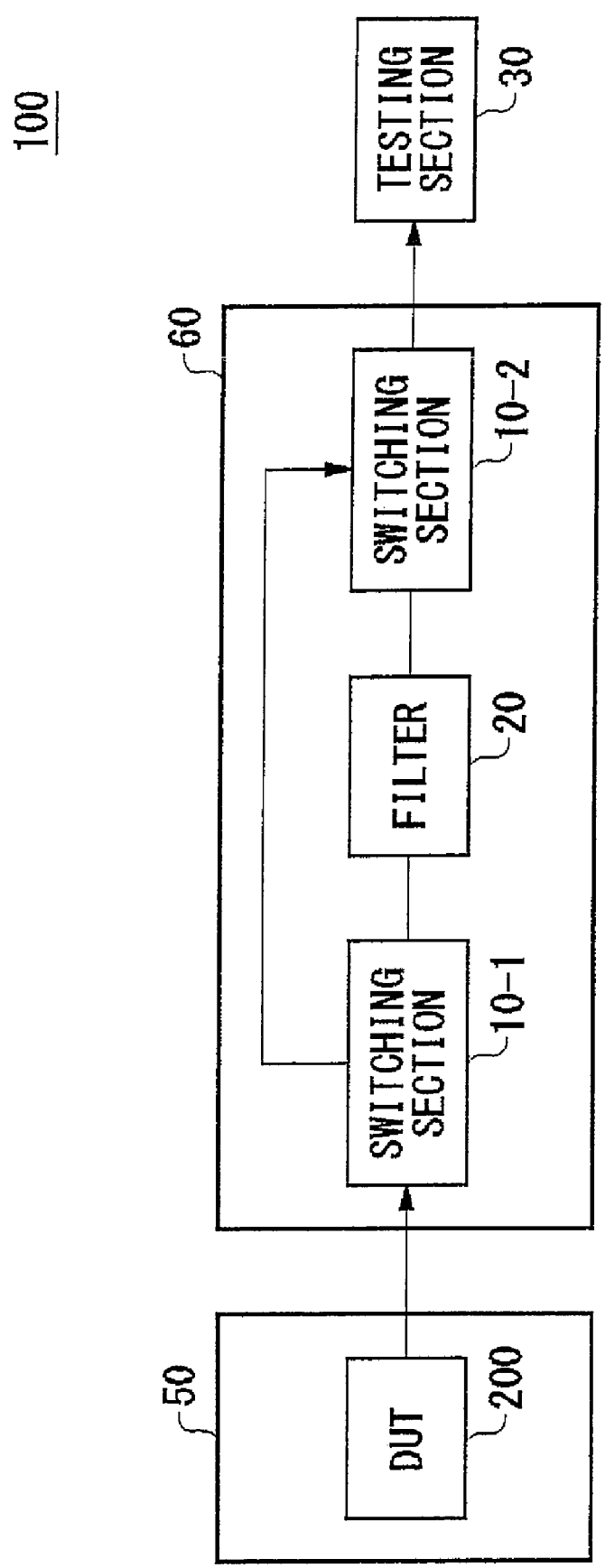
FIG. 10 illustrates another exemplary configuration of the test apparatus 100.

FIG. 10 illustrates another exemplary configuration of the test apparatus 100. According to the present example, the test apparatus 100 is different from the test apparatus 100 described with reference to FIG. 9 in that the switching sections 10, the filter 20 and the filter control section 40 are provided in the fixture board 60. According to this configuration, the filter 20 may use the cable provided in the fixture board 60 as the transmission lines 22 described with reference to FIG. 6. This makes it possible to efficiently provide the filter 20.

Figure 11:
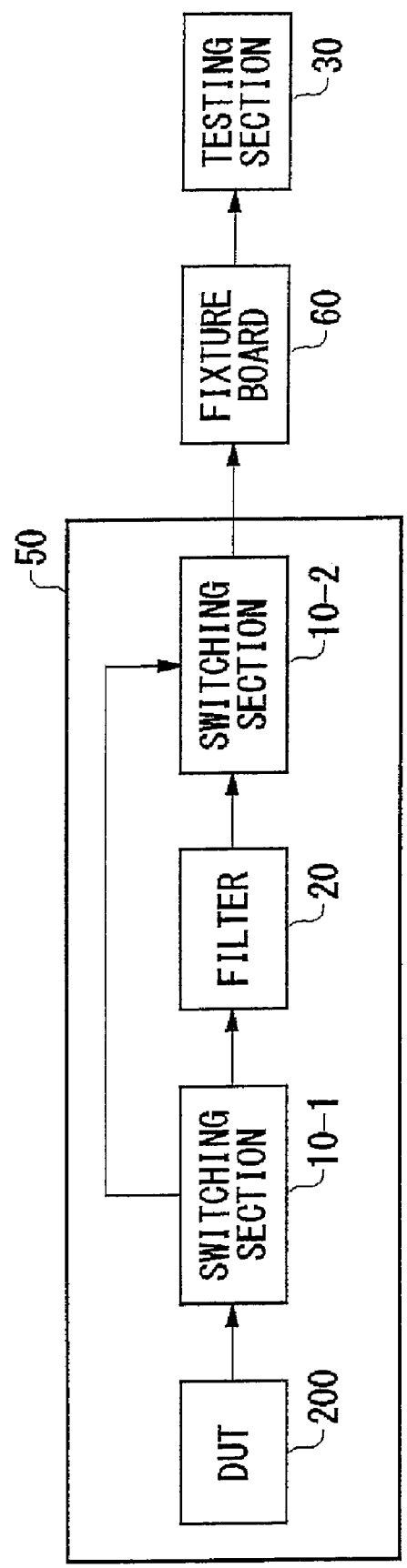
FIG. 11 illustrates another exemplary configuration of the test apparatus 100.

FIG. 11 illustrates another exemplary configuration of the test apparatus 100. According to the present example, the test apparatus 100 is different from the test apparatus 100 described with reference to FIG. 9 in that the switching sections 10, the filter 20 and the filter control section 40 are provided in the performance board 50. This configuration can also make it possible to accurately test the device under test 200 including the pre-emphasis circuit 210.

While the embodiment of the present invention has been described, the technical scope of the invention is not limited to the above described embodiment. It is apparent to persons skilled in the art that various alterations and improvements can be added to the above-described embodiment. It is also apparent from the scope of the claims that the embodiment added with such alternations or improvements can be included in the technical scope of the invention.

As is apparent from the above, the test apparatus 100 can accurately test the pre-emphasis function of a device under test including a pre-emphasis circuit.

What is claimed is:

1. A test apparatus for testing a pre-emphasis function of a device under test including a pre-emphasis circuit, the pre-emphasis circuit performing a pre-emphasis function of emphasizing a predetermined component of an output signal of the device under test and outputting the resulting output signal, the test apparatus comprising:
   a filter that attenuates the output signal output from the device under test in a substantially same manner as does a transmission line used when the device under test is implemented; and
   a testing section that measures the output signal output from the filter, and tests the pre-emphasis function of the device under test based on a result of the measurement.

2. A test apparatus for testing a device under test including a pre-emphasis circuit, the pre-emphasis circuit performing a pre-emphasis function of emphasizing a predetermined component of an output signal of the device under test and outputting the resulting output signal, the test apparatus comprising:
   a filter that attenuates the output signal output from the device under test in a substantially same manner as does a transmission line used when the device under test is implemented; and
   a testing section that measures the output signal output from the filter, and tests the pre-emphasis function of the device under test based on a result of the measurement, wherein
   the filter generates the attenuation by eliminating an emphasis component that is expected to be generated by the pre-emphasis circuit, from the output signal output from the device under test.

3. The test apparatus as set forth in claim 2, further comprising
   a filter control section that (i) is supplied in advance with emphasis component information about the emphasis component that is expected to be generated by the pre-emphasis circuit, and (ii) controls a signal pass characteristic of the filter based on the emphasis component information.

4. The test apparatus as set forth in claim 3, wherein
   the filter has a plurality of transmission lines each of which has a different line length, and
   the filter control section controls the signal pass characteristic by selecting one of the plurality of transmission lines for transmitting the output signal output from the device under test.

5. The test apparatus as set forth in claim 4, further comprising:
   a performance board that has the device under test placed thereon; and
   a fixture board that has a cable electrically connecting the testing section and the performance board to each other, wherein
   the filter is provided in the fixture board.

6. The test apparatus as set forth in claim 5, wherein
   the filter uses the cable provided in the fixture board as one or more of the plurality of transmission lines, through which the output signal is transmitted.

7. The test apparatus as set forth in claim 2, wherein
   the device under test includes a setting register that stores thereon a setting value indicating the emphasis component that is expected to be generated,
   the pre-emphasis circuit generates the emphasis component in accordance with the setting value stored on the setting register, and
   the test apparatus further comprises a filter control section that obtains the setting value stored on the setting register and controls a signal pass characteristic of the filter based on the obtained setting value.

8. The test apparatus as set forth in claim 7, wherein
   the filter has a plurality of transmission lines each of which has a different line length, and
   the filter control section controls the signal pass characteristic by selecting one of the plurality of transmission lines for transmitting the output signal output from the device under test.

9. The test apparatus as set forth in claim 8, further comprising:
   a performance board that has the device under test placed thereon; and
   a fixture board that has a cable electrically connecting the testing section and the performance board to each other, wherein
   the filter is provided in the fixture board.

10. The test apparatus as set forth in claim 9, wherein
    the filter uses the cable provided in the fixture board as one or more of the plurality of transmission lines, through which the output signal is transmitted.

11. The test apparatus as set forth in claim 2, wherein
    the testing section tests the pre-emphasis function of the device under test, by judging whether a set-up time and a hold time of the output signal output from the filter satisfy a set-up time and a hold time determined in advance for the device under test.

12. The test apparatus as set forth in claim 2, further comprising:
    a performance board that has the device under test placed thereon; and
    a fixture board that has a cable electrically connecting the testing section and the performance board to each other, wherein
    the filter is provided in the testing section.

13. The test apparatus as set forth in claim 2, further comprising
 a switching section that switches whether to input the output signal output from the device under test into the filter or the testing section.

14. The test apparatus as set forth in claim 13, further comprising
 a filter evaluating section that compares the output signal which has passed through the filter and the output signal which has not passed through the filter to each other, so as to evaluate whether a signal pass characteristic of the filter substantially matches a predetermined characteristic.

15. The test apparatus as set forth in claim 14, wherein
 when the filter evaluating section concludes that the signal pass characteristic of the filter is substantially the same as the predetermined characteristic, the testing section tests the pre-emphasis function of the device under test.

* * * * *